US012253408B2

(12) United States Patent
Li et al.

(10) Patent No.: US 12,253,408 B2
(45) Date of Patent: Mar. 18, 2025

(54) BATTERY MALFUNCTION DETECTION BY CORRELATING VIBRATIONS RESPONSE SPECTRUMS

(71) Applicant: SHENZHEN UNIVERSITY, Shenzhen (CN)

(72) Inventors: Xiaoyu Li, Shenzhen (CN); Shaohong Lin, Shenzhen (CN); Jindong Tian, Shenzhen (CN); Yong Tian, Shenzhen (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 150 days.

(21) Appl. No.: 16/972,572

(22) PCT Filed: Jun. 16, 2020

(86) PCT No.: PCT/CN2020/096303
§ 371 (c)(1),
(2) Date: Dec. 2, 2021

(87) PCT Pub. No.: WO2021/164156
PCT Pub. Date: Aug. 26, 2021

(65) Prior Publication Data
US 2023/0138536 A1    May 4, 2023

(30) Foreign Application Priority Data
Feb. 18, 2020   (CN) .......................... 202010099104.8

(51) Int. Cl.
*G01H 9/00*    (2006.01)
*G01M 7/02*    (2006.01)
(Continued)

(52) U.S. Cl.
CPC .............. *G01H 9/00* (2013.01); *G01M 7/025* (2013.01); *G01N 29/12* (2013.01); *G01N 29/348* (2013.01);
(Continued)

(58) Field of Classification Search
CPC .......... G01H 9/00; G01M 7/02; G01M 7/025; G01N 2291/0231; G01N 2291/2698;
(Continued)

(56) References Cited

U.S. PATENT DOCUMENTS

2013/0335094 A1* 12/2013 Adams ................ G01R 31/387
324/426
2016/0223498 A1*  8/2016 Steingart ............... G01N 29/46
(Continued)

FOREIGN PATENT DOCUMENTS

CN       105589010 A      5/2016
CN       108646200 A  * 10/2018   .......... G01R 31/36
(Continued)

OTHER PUBLICATIONS

Backman et al, Rechargeable Battery Condition Monitoring using Vibrational Properties, 2014 IEEE Symposium on Product Compliance Engineering (ISPCE) (Year: 2014).*
(Continued)

*Primary Examiner* — David L Singer

(57) ABSTRACT

A battery malfunction detection method includes: applying a preset number of vibration signals with different frequencies to a battery to be detected through a vibration generation device; collecting a response signal of the battery to be detected through a response collection device, where the response signal includes the preset number of vibration response amplitudes of the battery to be detected; determining whether the battery to be detected is malfunctioning according to the response signal.

15 Claims, 4 Drawing Sheets

(51) Int. Cl.
  *G01N 29/12* (2006.01)
  *G01N 29/34* (2006.01)
  *G01N 29/40* (2006.01)
  *G01N 29/44* (2006.01)
  *G01N 29/46* (2006.01)
  *G01R 31/392* (2019.01)

(52) U.S. Cl.
  CPC ......... *G01N 29/40* (2013.01); *G01N 29/4427* (2013.01); *G01N 29/46* (2013.01); *G01N 2291/0231* (2013.01); *G01N 2291/2698* (2013.01); *G01R 31/392* (2019.01)

(58) Field of Classification Search
  CPC ...... G01N 29/12; G01N 29/348; G01N 29/40; G01N 29/4427; G01N 29/46; G01R 31/382; G01R 31/392; Y02E 60/10
  See application file for complete search history.

(56) References Cited

U.S. PATENT DOCUMENTS

| | | | | |
|---|---|---|---|---|
| 2017/0261473 | A1* | 9/2017 | Sung | G01N 29/4481 |
| 2018/0120261 | A1* | 5/2018 | Hsieh | G01N 29/4418 |
| 2018/0164383 | A1* | 6/2018 | Hsieh | H01M 10/486 |
| 2019/0049518 | A1* | 2/2019 | Shen | G01N 29/48 |
| 2019/0072614 | A1* | 3/2019 | Steingart | G06N 5/046 |
| 2019/0094189 | A1* | 3/2019 | Hsieh | G01N 29/343 |
| 2019/0207274 | A1* | 7/2019 | Ladpli | G01N 29/07 |
| 2020/0057030 | A1* | 2/2020 | Hartwig | G01N 29/043 |
| 2020/0106137 | A1* | 4/2020 | Murphy | H01M 10/425 |
| 2020/0371165 | A1* | 11/2020 | Schweitzer | G01N 29/346 |
| 2021/0057783 | A1* | 2/2021 | Guillet | G01H 1/00 |
| 2021/0194070 | A1* | 6/2021 | Gitis | H01M 10/48 |
| 2021/0249702 | A1* | 8/2021 | Murphy | G01R 31/3865 |

FOREIGN PATENT DOCUMENTS

| | | | | |
|---|---|---|---|---|
| CN | 208333798 U | * | 1/2019 | G01M 7/02 |
| CN | 109632227 A | * | 4/2019 | G01M 7/025 |
| CN | 110118943 A | * | 8/2019 | G01N 29/043 |
| DE | 102011112641 B4 | * | 4/2018 | G01M 7/08 |
| JP | 2014122817 A | | 7/2014 | |
| KR | 20150045594 A | * | 4/2015 | G01N 29/14 |
| KR | 20180063927 A | * | 6/2018 | G01N 29/12 |
| WO | WO-2018119718 A1 | * | 7/2018 | A61B 8/00 |
| WO | WO-2019172655 A1 | * | 9/2019 | G01N 29/043 |

OTHER PUBLICATIONS

International Search Report, PCT/CN2020/096303, mailed Nov. 20, 2020, 4 pages.

* cited by examiner

BATTERY MALFUNCTION DETECTION BY CORRELATING VIBRATIONS RESPONSE SPECTRUMS

CROSS REFERENCE TO RELATED APPLICATIONS

This application is a National Stage of PCT Application No. PCT/CN2020/096303 filed on Jun. 16, 2020, which claims priority to Chinese Patent Application No. 202010099104.8 filed on Feb. 18, 2020, the contents each of which are incorporated herein by reference thereto.

TECHNICAL FIELD

The present application involves in the field of battery technologies, and particularly to a battery malfunction detection method, a battery malfunction detection system, and a computer product.

BACKGROUND

At present, echelon utilization of a decommissioned battery of an electric vehicle is currently a hot issue. Before the echelon utilization of the decommissioned battery, the state of the decommissioned battery needs to be detected to distinguish whether the decommissioned battery is malfunctioning.

Technical Problem

The existing solution for detecting the state of the decommissioned battery is realized through performing a charging and discharging characteristic experiment on the decommissioned battery by using a traditional battery charging and discharging equipment. Not only this solution takes a long time, but also a series of experiments on the decommissioned battery cause a loss to the decommissioned battery itself.

SUMMARY

Given the above, the present application proposes a battery malfunction detection method, a battery malfunction detection system, a terminal and a computer-readable storage medium, which can quickly and non-destructively detect whether a battery is malfunctioning.

The first aspect of the present application provides a battery malfunction detection method applied to a terminal, the terminal is connected to a vibration generation device configured to apply a vibration signal to a battery to be detected, and connected to a response collection device configured to collect a vibration response amplitude of the battery to be detected. The battery malfunction detection method includes:
  applying a preset number of vibration signals with different frequencies to the battery to be detected through the vibration generation device;
  collecting a response signal of the battery to be detected through the response collection device, here the response signal includes the preset number of vibration response amplitudes of the battery to be detected, and the preset number of vibration response amplitudes of the battery to be detected are generated by the battery to be detected under an action of the vibration signals with different frequencies respectively;
  determining whether the battery to be detected is malfunctioning according to the response signal.

The second aspect of the present application provides a battery malfunction detection system including a terminal, a vibration generation device connected to the terminal, and a response collection device connected to the terminal;
  here the vibration generation device is configured to apply a vibration signal to a battery to be detected;
  the response collection device is configured to collect a vibration response amplitude of the battery to be detected;
  the terminal includes:
  a vibration generation unit configured to sequentially apply a preset number of vibration signals with different frequencies to the battery to be detected through the vibration generation device;
  a response collection unit configured to collect a response signal of the battery to be detected through the response collection device, here the response signal includes the preset number of vibration response amplitudes of the battery to be detected which are generated by the battery to be detected under an action of the vibration signals with different frequencies respectively;
  a malfunction determination unit configured to determine whether the battery to be detected is malfunctioning according to the response signal.

The third aspect of the present application provides a computer product including a computer-readable storage medium which a computer program is stored thereon. The computer program, when executed by a processor, substantially implements all or part of the method provided by the first aspect.

Beneficial Effects

It can be seen from the above that, in the solutions of the present application, the preset number of vibration signals with different frequencies are sequentially applied to the battery to be detected through the vibration generation device; the response signal of the battery to be detected is collected by the response collection device, and the response signal includes the preset number of vibration response amplitudes of the battery to be detected, and the preset number of vibration response amplitudes of the battery to be detected are generated by the battery to be detected under the action of the vibration signals with different frequencies respectively; and whether the battery to be detected is malfunctioning is determined according to the response signal. The solutions of the present application can quickly and non-destructively detect whether the battery is malfunctioning by analyzing the vibration characteristics of the battery.

DESCRIPTION OF THE DRAWINGS

In order to more clearly describe the technical solutions in the embodiments of the present application, the accompanying drawings required to be used in the description of the embodiments or the prior art are briefly introduced below. Obviously, the accompanying drawings in the following description are only some embodiments of the present application, and other drawings may be obtained based on these drawings without creative work for those of ordinary skill in the art.

EMBODIMENTS OF THE APPLICATION

In the following description, specific details such as a structure of a specific system and a specific technology are proposed for the purpose of illustration rather than limitation so as to thoroughly understand the embodiments of the present application. However, it should be understood to those skilled in the art that the present application can also be implemented in other embodiments without these specific details. In other cases, detailed descriptions of well-known systems, devices, circuits, and methods are omitted to avoid unnecessary details from interfering the description of the present application.

It should be understood that when used in the specification and appended claims of the present application, the term "comprising" indicates the existence of a described feature, whole, step, operation, element and/or component, but does not exclude the existence or addition of one or more other features, wholes, steps, operations, elements, components, and/or combinations thereof.

It should also be understood that the term "and/or" used in the specification and the appended claims of the present application refers to any combination and all possible combinations of one or more of the associated listed items, and includes these combinations.

As used in the specification and the appended claims of the present application, the term "if" can be interpreted as "when" or "once" or "in response to determination of . . . " or "in response to detection of . . . ". Similarly, the phrase "if . . . is determined" or "if [a described condition or event] is detected" can be interpreted as meaning "once . . . is determined" or "in response to determination of . . . " or "once [a described condition or event] is detected" or "in response to detection of [a described condition or event]" depending on the context.

In addition, in the description of the specification and the appended claims of the present application, the terms "first", "second", "third", etc. are only used to distinguish the description, and cannot be understood as indicating or implying relative importance.

The reference to "one embodiment" or "some embodiments" described in the specification of the present application means that one or more embodiments of the present application include a specific feature, structure, or characteristic described in combination with the embodiment. Therefore, the words "in one embodiment", "in some embodiments", "in some other embodiments", "in other embodiments", etc. appearing in different places of this specification are not necessarily all refer to the same embodiment, but mean "one or more but not all embodiments", unless otherwise specifically emphasized in other ways. The terms "including", "having", "being provided with" and their variations all mean "including but not limited to", unless otherwise specifically emphasized in other ways.

Figure 1:
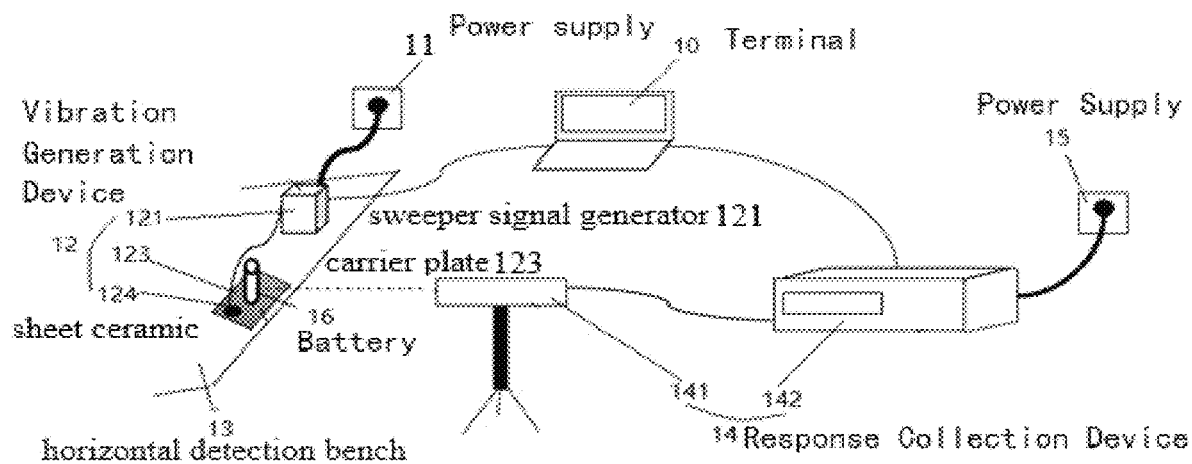
FIG. 1 is a schematic structural diagram of the battery malfunction detection system provided by an embodiment of the present application.

FIG. 1 shows a schematic structural diagram of the battery malfunction detection system provided by an embodiment of the present application. In FIG. 1, the above battery malfunction detection system includes: a terminal 10, a vibration generation device 12 connected to the terminal 10, and a response collection device 14 connected to the terminal 10, a power supply 11 connected to the vibration generation device 12, and a power supply 15 connected to the response collection device 14. Under the control of the terminal 10, the vibration generation device 12 applies a vibration signal to a battery 16 to be detected to make the battery 16 to be detected vibrate, and the response collection device 14 collects a vibration response amplitude of the battery 16 to be detected in real time, and sends the collected vibration response amplitude to the terminal 10. Optionally, the vibration response amplitude may be the maximum value of vibration speeds of the battery 16 to be detected. The terminal 10 may determine whether the battery 16 to be detected is malfunctioning according to the received vibration response amplitude, thereby realizing rapid malfunction detection for the battery 16 to be detected.

Optionally, the vibration generation device 12 includes a sweeper signal generator 121, a sheet ceramic 124 and a carrier plate 123. An input end of the sweeper signal generator 121 is connected in communication with the terminal 10, and the sweeper signal generator 121 generates a sinusoidal electrical signal under the control of the terminal 10. The sheet ceramic 124 is connected to an output end of the sweeper signal generator 121, and converts the sinusoidal electrical signal into a vibration signal when receiving the sinusoidal electrical signal output by the sweeper signal generator 121. The sheet ceramic 124 is fixedly connected to the carrier plate 123, the battery 16 to be detected is placed on a placement position of the carrier plate 123, and the sheet ceramic 124 is not in contact with the battery 16 to be detected. When the sheet ceramic 124 outputs the vibration signal, the vibration signal may be transmitted to the battery 16 to be detected through the carrier plate 123, and thus there will not be a loss to the battery 16 to be detected. It should be understood that in actual operations, the sweeper signal generator 121 needs to be connected to the power supply 11, and the sweeper signal generator 121 and the carrier plate 123 are both placed on a horizontal detection bench 13 to ensure that the battery 16 to be detected can be stably placed on the carrier plate 123.

Optionally, in the battery malfunction detection system provided by an embodiment of the present application, the sheet ceramic 124 may be replaced with a speaker. Through the speaker, the sinusoidal electrical signal may also be converted into the vibration signal.

Optionally, the battery malfunction detection system provided by an embodiment of the present application may be applicable to a cylindrical battery, a square battery, a pouch cell, and the like.

Optionally, the battery 16 to be detected may be placed vertically on the placement position of the carrier plate 123 or horizontally on the placement position of the carrier plate 123.

Optionally, the response collection device 14 includes a signal processor 142 and a laser interferometer 141. The laser interferometer 141 is connected to the signal processor 142. The laser interferometer 141 emits a first laser signal (as shown by the dotted line in FIG. 1) to a surface of the battery 16 to be detected, and receives a second laser signal reflected back from the surface of the battery 16 to be detected, and then sends the second laser signal to the signal processor 142. The signal processor 142 is connected to the terminal 10. When receiving the second laser signal, the signal processor 142 processes the second laser signal to acquire a frequency of the vibration signal transmitted to the battery 16 to be detected and the vibration response amplitude of the battery 16 to be detected generated under the action of the vibration signal, and sends the acquired frequency and vibration response amplitude of the battery 16 to be detected to the terminal 10. It should be understood that, in actual operations, the signal processor 142 is connected to the power supply 15, and the lens of the laser interferometer 141 is slightly higher than the carrier plate 123 and faces the carrier plate 123, so as to ensure that the first laser signal outgoing from the lens may irradiate vertically on the surface of the battery 16 to be detected by fine adjustment.

Figure 2:
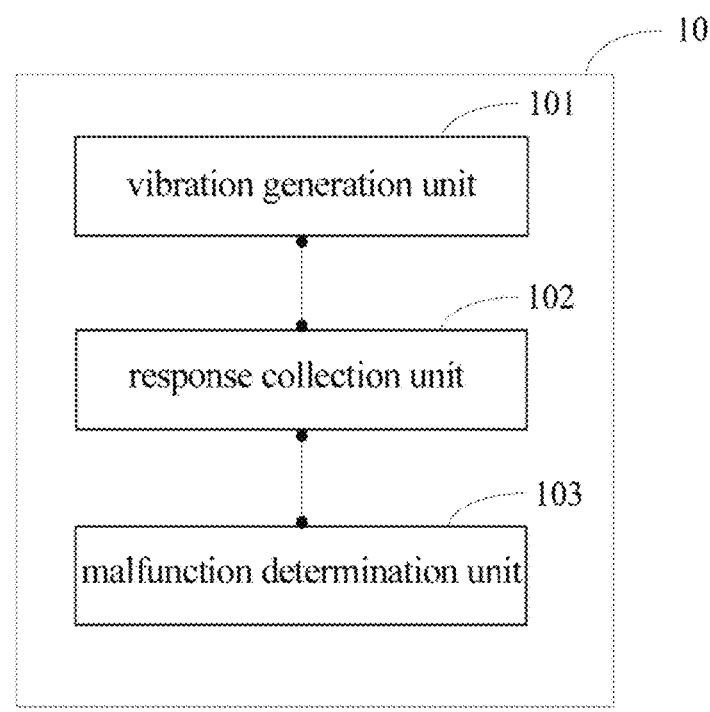
FIG. 2 is a schematic structural diagram of a terminal in the battery malfunction detection system provided by an embodiment of the present application.

FIG. 2 shows a schematic structural diagram of the terminal 10, in which only parts related to the embodiment of the present application are shown for ease of description.

The terminal 10 specifically includes:
a vibration generation unit 101 configured to sequentially apply a preset number of vibration signals with different frequencies to the battery to be detected through the vibration generation device;
a response collection unit 102 configured to collect a response signal of the battery to be detected through the response collection device, here the response signal includes the preset number of vibration response amplitudes of the battery to be detected which are generated by the battery to be detected under the action of the vibration signals with different frequencies;
a malfunction determination unit 103 configured to determine whether the battery to be detected is malfunctioning according to the response signal.

Optionally, the malfunction determination unit 103 specifically includes:
a match subunit configured to match the response signal with response samples of a plurality of battery samples in a preset response sample library one by one, here the response sample library includes a response sample of at least one malfunctioning battery sample and a response sample of at least one battery sample that is not malfunctioning, and each response sample corresponds to a piece of identification information used to indicate whether the battery sample associated with the response sample is malfunctioning, and the response sample includes the preset number of vibration response amplitudes of the associated battery sample, here the preset number of vibration response amplitudes of the battery sample are generated by the associated battery sample under the action of the vibration signals with different frequencies;
a sample determination subunit configured to determine a best matching response sample which has the largest match degree with the response signal from the response samples of the plurality of the battery samples;
a malfunction determination subunit configured to determine whether the battery to be detected is malfunctioning according to the identification information corresponding to the best matching response sample.

Optionally, the malfunction determination subunit specifically includes:
a first malfunction determination subunit configured to determine that the battery to be detected is malfunctioning if the identification information corresponding to the best matching response sample indicates that the battery sample corresponding to the best matching response sample is malfunctioning;
a second malfunction determination subunit configured to determine that the battery to be detected is not malfunctioning if the identification information corresponding to the best matching response sample indicates that the battery sample corresponding to the best matching response sample is not malfunctioning.

Optionally, the match subunit specifically includes:
a spectrum generation subunit configured to generate a response spectrum according to a target response sample, here an abscissa of the response spectrum indicates the frequency, an ordinate of the response spectrum indicates the vibration response amplitude, and the target response sample is the response sample of any one battery sample in the response sample library;
a detection point acquisition subunit configured to acquire a peak point in the response spectrum and at least two neighboring points nearest to the peak point and determine the peak point and the neighboring points as detection points;
a first standard deviation calculation subunit configured to calculate a standard deviation of the vibration response amplitudes corresponding to the detection points and determine this standard deviation as a first standard deviation;
a target amplitude acquisition subunit configured to acquire the vibration response amplitudes of the battery to be detected from the response signal under the action of the vibration signals with at least two target frequencies so as to acquire at least two target vibration response amplitudes, here the at least two target frequencies are frequencies corresponding to the detection points;
a second standard deviation calculation subunit configured to calculate a standard deviation of the at least two target vibration response amplitudes and determine this standard deviation as a second standard deviation;
an absolute value calculation subunit configured to calculate an absolute difference between the first standard deviation and the second standard deviation;
a match degree calculation subunit configured to acquire a match degree between the response signal and the target response sample according to the absolute difference.

Optionally, the match subunit specifically includes:
a correlation analysis subunit configured to analyze correlation between the response signal and the target response sample to acquire a correlation coefficient between the response signal and the target response sample, here the target response sample is the response sample of any one battery sample in the response sample library;
a match degree determination subunit configured to determine the correlation coefficient as the match degree between the response signal and the target response sample.

Optionally, the match subunit further includes:
a filtering subunit configured to filter out the vibration response amplitude less than a preset response threshold from the response signal and the target response sample.

Optionally, the correlation analysis subunit specifically includes:
a correlation coefficient determination subunit configured to perform correlation analysis on a retained response signal and a retained target response sample to acquire the correlation coefficient between the response signal and the target response sample.

It can be seen from the above that, in the solution of the present application, the preset number of vibration signals with different frequencies are sequentially applied to the battery to be detected through the vibration generation device, so that the battery to be detected generates one vibration response amplitude under the action of each of the vibration signals respectively; the response signal of the battery to be detected is collected by the response collection device, and the response signal includes the preset number of vibration response amplitudes of the battery to be detected; and whether the battery to be detected is malfunctioning is determined according to the response signal. The solution of the present application can quickly and non-destructively detect whether the battery is malfunctioning by analyzing the vibration characteristics of the battery.

Figure 3:
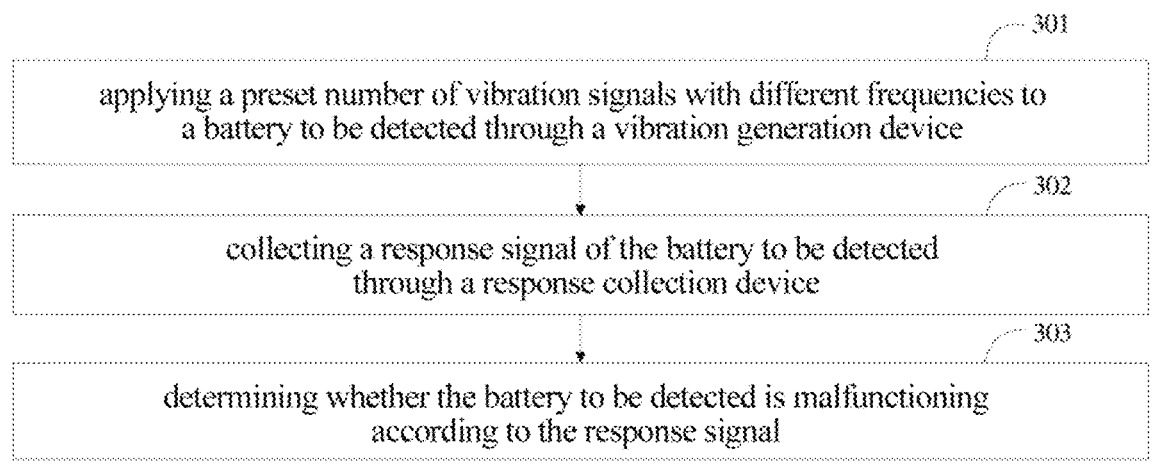
FIG. 3 is a schematic flowchart of the battery malfunction detection method provided by an embodiment of the present application.

FIG. 3 shows a flowchart of the battery malfunction detection method provided by an embodiment of the present application. The battery malfunction detection method is applied to a terminal, and the terminal is connected with a vibration generation device configured to apply a vibration signal to the battery to be detected and a response collection device configured to collect a vibration response amplitude of the battery to be detected, which is detailed as follows.

At step 301, apply a preset number of vibration signals with different frequencies to the battery to be detected through the vibration generation device.

In this embodiment of the present application, the terminal controls the vibration generation device to sequentially apply the preset number of vibration signals to the battery to be detected. The value of the preset number should be as large as possible to ensure the accuracy of the detection result, for example, the preset number is equal to 1000. Among the preset number of vibration signals, different vibration signals are provided with different frequencies. Optionally, one vibration signal may be applied to the battery to be detected at every same time interval until the preset number of vibration signals are applied to the battery to be detected, and the frequencies of the vibration signals are successively increased with equal difference. For example, one vibration signal is applied to the battery to be detected every 1 second, and the frequency of the vibration signal applied to the battery to be detected in the next second is 1750 Hz greater than the frequency of the vibration signal currently applied to the battery to be detected. It should be noted that the selection of the frequency of the vibration signal is determined by factors such as the shape, size, structure, and material etc. of the battery to be detected.

At step 302, collect a response signal of the battery to be detected through the response collection device.

Figure 4:
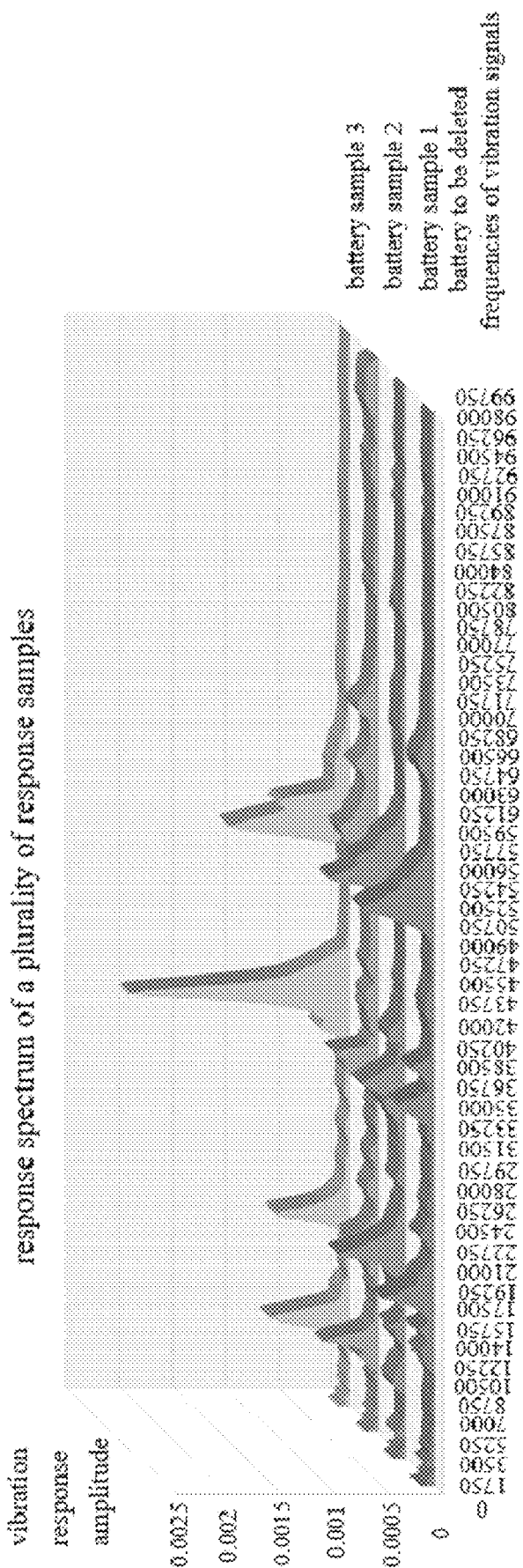
FIG. 4 is an exemplary chart of response spectrums provided by an embodiment of the present application.

In the embodiment of the present application, each time when one vibration signal is applied to the battery to be detected, the battery to be detected will generate one vibration response amplitude corresponding to this vibration signal. The terminal collects the response signal of the battery to be detected through the response collection device. The response signal includes the preset number of vibration response amplitudes of the battery to be detected, and each vibration response amplitude in the response signal is generated by the battery to be detected under the action of one of the vibration signals of the preset number of vibration signals with different frequencies. As shown in FIG. 4, the response signal is represented by the response spectrum for ease of explanation, and the fourth curve counted from the top to the bottom in FIG. 4 is the response spectrum corresponding to the response signal. In the response spectrum corresponding to the response signal, the frequencies (unit: Hz) of the vibration signals are taken as the abscissa, and the vibration response amplitudes (unit: m/s) are taken as the ordinate. It should be understood that the response spectrum of the response signal in FIG. 4 is only an example.

At step 303, determine whether the battery to be detected is malfunctioning according to the response signal.

In the embodiment of the present application, the response signal can reflect the vibration characteristics of the battery to be detected under the action of the preset number of vibration signals with different frequencies. The batteries to be detected under different states (such as the battery to be detected that is malfunctioning and the battery to be detected that is not malfunctioning) show different vibration characteristics under the action of the preset number of vibration signals with different frequencies. Therefore, through analyzing the vibration characteristics reflected by the response signal, it can be determined whether the battery to be detected associated with the response signal is malfunctioning.

Optionally, for the same battery to be detected, the above steps 301 and 302 may be repeatedly performed to acquire a plurality of response signals of the battery to be detected. Among the plurality of response signals, an average value of the vibration response amplitudes generated by the battery to be detected under the action of vibration signals with the same frequency may be acquired. All acquired average values may be combined as an average response signal, and whether the battery to be detected is malfunctioning is determined based on the average response signal, which is capable of improving the accuracy of the detection result.

Optionally, the foregoing step 303 specifically includes:

A1: matching the response signal with response samples of a plurality of battery samples in a preset response sample library one by one;

A2: determining a best matching response sample which has the largest match degree with the response signal from the response samples of the plurality of the battery samples;

A3: determining whether the battery to be detected is malfunctioning according to the identification information corresponding to the best matching response sample.

Specifically, the preset response sample library includes a plurality of response samples, each response sample is associated with one battery sample, and each response sample includes the preset number of vibration response amplitudes of the battery sample associated with this response sample. Each response sample is acquired by the following method: the preset number of vibration signals with different frequencies are sequentially applied to the battery sample through the vibration generation device so that the battery sample generates the preset number of vibration response amplitudes, and the preset number of vibration response amplitudes generated by the battery sample are collected by the response collection device and are used as one response sample. It should be noted that the preset number of vibration signals with different frequencies sequentially applied to the battery sample are the same as those applied to the battery to be detected, and the battery sample and the battery to be detected should belong to the same kind of battery. In order to be able to determine whether the battery to be detected is malfunctioning, the response sample library should include a response sample of at least one malfunctioning battery sample and a response sample of at least one battery sample that is not malfunctioning. In the response sample library, each response sample corresponds to one piece of identification information, and the identification information is used to indicate whether the battery sample associated with the response sample corresponding to the identification information is malfunctioning. The response signal is matched with the plurality of response samples in the response sample library one by one, and the response sample having the largest match degree with the response signal is determined as the best matching response sample. After the best matching response sample is determined, the identification information corresponding to the best matching response sample is acquired, and whether the battery to be detected is malfunctioning may be determined by analyzing the identification information corresponding to the best matching response sample.

Further, as shown in FIG. 4, the response samples are represented by response spectrums for ease of explanation, and the first three curves counted from the top to the bottom in FIG. 4 are the response spectrums corresponding to the three response samples. In the response spectrums corresponding to the response samples, the frequencies (unit: Hz) of the vibration signals are taken as the abscissa, and the vibration response amplitudes (unit: m/s) are taken as the ordinate. According to the order from the top to the bottom, the first curve is the response spectrum corresponding to the response sample associated with the malfunctioning battery sample 3, the second curve is the response spectrum corresponding to the response sample associated with the battery sample 2 that is not malfunctioning, and the third curve is the response spectrum corresponding to the response sample associated with the battery sample 1 that is not malfunctioning. It should be understood that the response spectrums of the response samples in FIG. 4 are only examples.

Optionally, the above step A3 specifically includes:

B1: determining that the battery to be detected is malfunctioning if the identification information corresponding to the best matching response sample indicates that the battery sample corresponding to the best matching response sample is malfunctioning;

B2: determining that the battery to be detected is not malfunctioning if the identification information corresponding to the best matching response sample indicates that the battery sample corresponding to the best matching response sample is not malfunctioning.

Specifically, the battery sample corresponding to the best matching response sample is best approaching the state of the battery to be detected. Therefore, according to the indication of the identification information corresponding to the best matching response sample, if the battery sample corresponding to the best matching response sample is malfunctioning, then the battery to be detected is determined to be malfunctioning; if the battery sample corresponding to the best matching response sample is not malfunctioning, then battery to be detected is determined to be not malfunctioning.

Optionally, the above step A1 specifically includes:

C1: generating a response spectrum according to a target response sample;

C2: acquiring a peak point in the response spectrum and at least two neighboring points nearest to the peak point and determining the peak point and the neighboring points as detection points;

C3: calculating a standard deviation of the vibration response amplitudes corresponding to the detection points and determining this standard deviation as a first standard deviation;

C4: acquiring the vibration response amplitudes of the battery to be detected from the response signal under the action of the vibration signals with at least two target frequencies so as to acquire at least two target vibration response amplitudes;

C5: calculating a standard deviation of the at least two target vibration response amplitudes and determining this standard deviation as a second standard deviation;

C6: calculating an absolute difference between the first standard deviation and the second standard deviation;

C7: acquiring a match degree between the response signal and the target response sample according to the absolute difference.

It will be understandable that, since the same or similar operations are performed when the response signal is matched with each response sample, arbitrary one response sample in the response sample library will be taken as an example to introduce for the convenience of explanation, and this response sample is the target response sample. Specifically, the response spectrum corresponding to the target response sample is generated, the peak point in the response spectrum corresponding to the target response sample and at least two neighboring points nearest to the peak point are acquired, and all the acquired peak points and neighboring points are used as the detection points.

As a preferred implementation of this embodiment, the peak point may refer to the global peak point corresponding to the global maximum value in the response spectrum of the target response sample. In this case, the global peak point and the at least two neighboring points nearest to the global peak point may be used as the detection points. For example, the maximum value of the zero-order frequency spectrum in the response spectrum of the target response sample may be used as the global peak point.

As another preferred implementation of this embodiment, the peak point may also refer to a plurality of local peak points corresponding to a plurality of local maximum values in the response spectrum of the target response sample. In this case, the plurality of local peak points and the at least two neighboring points nearest to each of the local peak points may all be used as the detection points. For example, one local maximum point of the zero-order frequency spectrum and two local maximum points of the first-order frequency spectrum in the response spectrum of the target response sample may be used as three local peak points of the response spectrum. According to needs, the local maximum points in a higher-order frequency spectrum may also be extracted as the local peak points as well. As an example, the peak points in the response spectrum corresponding to the target response sample and four neighboring points nearest to each of the peak points may be acquired as the detection points. For example, if there are 3 peak points, then a total of 12 neighboring points may be acquired and these 15 points are used as the detection points.

Further, each detection point corresponds to one vibration response amplitude (that is, the ordinate of the detection point), and the standard deviation of the vibration response amplitudes corresponding to all the detection points is calculated and recorded as the first standard deviation. In the response signal, the vibration response amplitudes of the battery to be detected are acquired under the action of the vibration signals with at least two target frequencies, and the target frequencies are the frequencies corresponding to all the detection points (that is, the abscissa of the detection points). For example, if the frequencies corresponding to three detection points are 17500 Hz, 35000 Hz and 52500 Hz respectively, then there are three target frequencies of 17500 Hz, 35000 Hz and 52500 Hz respectively. The vibration response amplitudes of the battery to be detected generated under the action of the vibration signals with at least two target frequencies are recorded as the target vibration response amplitudes. The standard deviation of all the target vibration response amplitudes is calculated and recorded as the second standard deviation. The absolute difference between the first standard deviation and the second standard deviation is calculated, and the smaller the absolute difference between the first standard deviation and the second standard deviation, the larger the match degree between the response signal and the target response sample. Optionally, the reciprocal of the absolute difference between the first standard deviation and the second standard deviation may be used as the match degree.

Exemplarily, the response spectrum corresponding to the target response sample may be any one of the first three curves counted from the top to the bottom in FIG. 4. When the frequency corresponding to one peak point is equal to 35000 Hz, the two neighboring points nearest to the peak point are two points the abscissas (frequencies) of which are equal to 33250 Hz and 36750 Hz in the response spectrum corresponding to the target response sample.

Optionally, the above step A1 specifically includes:
D1: analyzing correlation between the response signal and the target response sample to acquire a correlation coefficient between the response signal and the target response sample;
D2: determining the correlation coefficient as the match degree between the response signal and the target response sample.

It will be understandable that, since the same or similar operations are performed when the response signal is matched with each response sample, arbitrary one response sample in the response sample library will be taken as an example to introduce for the convenience of explanation, and this response sample is the target response sample. Specifically, correlation analysis is performed on the preset number of vibration response amplitudes in the response signal and the preset number of vibration response amplitudes in the target response sample to acquire the correlation coefficient between the response signal and the target response sample. The correlation coefficient is used as the match degree between the response signal and the target response sample.

Optionally, before the above step D1, the method further includes:
filtering out the vibration response amplitude less than a preset response threshold from the response signal and the target response sample.

Specifically, the vibration response amplitude generated by the battery to be detected is relatively large when the vibration signal with a resonance frequency is applied to the battery to be detected, and the vibration response amplitude generated by the battery to be detected is relatively small when the vibration signal with a non-resonant frequency is applied to the battery to be detected, and the accuracy of correlation analysis will be affected to a certain degree when the vibration response amplitude is too small. Therefore, the vibration response amplitudes in the response signal and the target response sample may be traversed, the vibration response amplitude less than the preset response threshold may be filtered out, and the vibration response amplitudes greater than or equal to the response threshold in the response signal and the target response sample may be retained.

Optionally, the above step D1 specifically includes:
performing correlation analysis on a retained response signal and a retained target response sample to acquire the correlation coefficient between the response signal and the target response sample.

Specifically, the correlation analysis is performed on the vibration response amplitudes of the retained response signal and the vibration response amplitudes of the retained target response sample to acquire the correlation coefficient between the response signal and the target response sample.

It can be seen from the above that, in the solution of the present application, the preset number of vibration signals with different frequencies are sequentially applied to the battery to be detected through the vibration generation device, so that the battery to be detected generates one vibration response amplitude under the action of each of the vibration signals respectively; the response signal of the battery to be detected is collected by the response collection device, and the response signal includes the preset number of vibration response amplitudes of the battery to be detected; and whether the battery to be detected is malfunctioning is determined according to the response signal. The solution of the present application can quickly and non-destructively detect whether the battery is malfunctioning by analyzing the vibration characteristics of the battery.

It should be understood that the sequence number of each step of the foregoing embodiments does not mean the order of execution. The execution sequence of each process should be determined by its function and internal logic, and should not constitute any limitation on the implementation processes of the embodiments of the present application.

Figure 5:
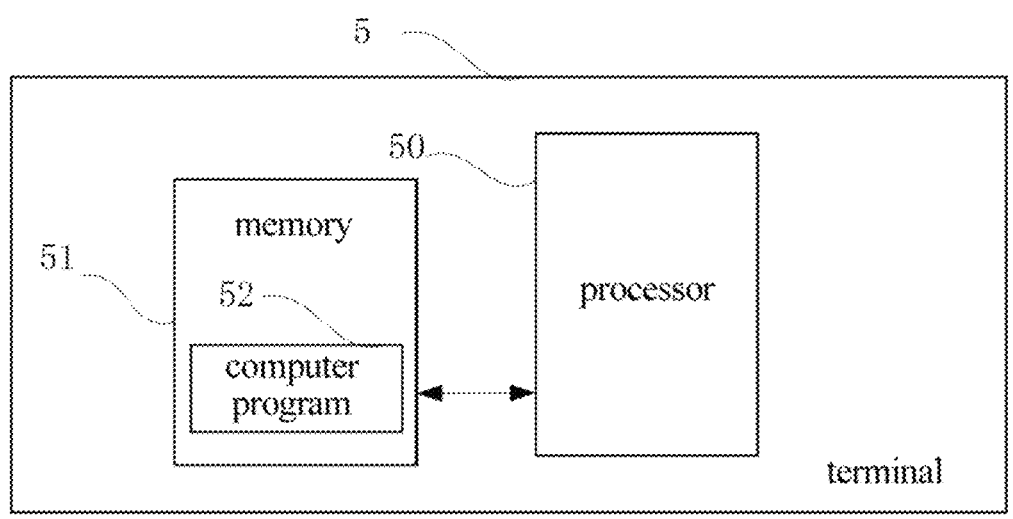
FIG. 5 is a schematic structural diagram of a terminal provided by an embodiment of the present application.

FIG. 5 is a schematic structural diagram of a terminal 5 provided by an embodiment of the present application. As shown in FIG. 5, the terminal 5 of this embodiment includes: at least one processor 50 (only one is shown in FIG. 5), a memory 51, and a computer program 52 stored in the memory 51 and executable on the at least one processor 50. The processor 50, when executing the computer program 52, implements the following steps of:
applying a preset number of vibration signals with different frequencies to the battery to be detected through the vibration generation device;
collecting a response signal of the battery to be detected through the response collection device, here the response signal includes the preset number of vibration response amplitudes of the battery to be detected which are generated by the battery to be detected under the action of the vibration signals with different frequencies;
determining whether the battery to be detected is malfunctioning according to the response signal.

Assuming that the above manner is the first possible implementation, then in the second possible implementation provided on the basis of the first possible implementation, the step of determining whether the battery to be detected is malfunctioning according to the response signal includes:
matching the response signal with response samples of a plurality of battery samples in a preset response sample library one by one, here the response sample library includes a response sample of at least one malfunctioning battery sample and a response sample of at least one battery sample that is not malfunctioning, and each response sample corresponds to a piece of identification information used to indicate whether the battery sample associated with the response sample is malfunctioning, and the response sample includes the preset number of vibration response amplitudes of the associated battery sample, here the preset number of vibration response amplitudes of the battery sample are generated by the associated battery sample under the action of the vibration signals with different frequencies;

determining a best matching response sample which has the largest match degree with the response signal from the response samples of the plurality of the battery samples;

determining whether the battery to be detected is malfunctioning according to the identification information corresponding to the best matching response sample.

In the third possible implementation provided on the basis of the second possible implementation, the step of determining whether the battery to be detected is malfunctioning according to the identification information corresponding to the best matching response sample includes:

determining that the battery to be detected is malfunctioning if the identification information corresponding to the best matching response sample indicates that the battery sample corresponding to the best matching response sample is malfunctioning;

determining that the battery to be detected is not malfunctioning if the identification information corresponding to the best matching response sample indicates that the battery sample corresponding to the best matching response sample is not malfunctioning.

In the fourth possible implementation provided on the basis of the second possible implementation or the third possible implementation, the step of matching the response signal with response samples of a plurality of battery samples in a preset response sample library one by one includes:

generating a response spectrum according to a target response sample, here an abscissa of the response spectrum indicates the frequency, an ordinate of the response spectrum indicates the vibration response amplitude, and the target response sample is the response sample of any one battery sample in the response sample library;

acquiring a peak point in the response spectrum and at least two neighboring points nearest to the peak point and determining the peak point and the neighboring points as detection points;

calculating a standard deviation of the vibration response amplitudes corresponding to the detection points and determining this standard deviation as a first standard deviation;

acquiring the vibration response amplitudes of the battery to be detected from the response signal under the action of the vibration signals with at least two target frequencies so as to acquire at least two target vibration response amplitudes, here the at least two target frequencies are frequencies corresponding to the detection points;

calculating a standard deviation of the at least two target vibration response amplitudes and determining this standard deviation as a second standard deviation;

calculating an absolute difference between the first standard deviation and the second standard deviation;

acquiring a match degree between the response signal and the target response sample according to the absolute difference.

In the fifth possible implementation provided on the basis of the second possible implementation or the third possible implementation, the step of matching the response signal with response samples of a plurality of battery samples in a preset response sample library one by one includes:

analyzing correlation between the response signal and the target response sample to acquire a correlation coefficient between the response signal and the target response sample, here the target response sample is the response sample of any one battery sample in the response sample library;

determining the correlation coefficient as the match degree between the response signal and the target response sample.

In the sixth possible implementation provided on the basis of the fifth possible implementation, before analyzing correlation between the response signal and the target response sample to acquire a correlation coefficient between the response signal and the target response sample, the steps further include:

filtering out the vibration response amplitude less than a preset response threshold from the response signal and the target response sample.

correspondingly, step of analyzing correlation between the response signal and the target response sample to acquire a correlation coefficient between the response signal and the target response sample includes:

performing correlation analysis on a retained response signal and a retained target response sample to acquire the correlation coefficient between the response signal and the target response sample.

The aforementioned terminal 5 may be a computing device such as a mobile phone, a desktop computer, a notebook, a palmtop computer, and a cloud server etc. The terminal may include, but is not limited to, a processor 50 and a memory 51. Those skilled in the art can understand that FIG. 5 is only an example of the terminal 5, and does not constitute a limitation on the terminal 5. It may include more or less components than those as shown, or a combination of certain components, or different components, for example, it may also include an input and output device, a network access device, and so on.

The so-called processor 50 may be a central processing unit (CPU), and the processor 50 may also be other general-purpose processor, digital signal processor (DSP), and application-specific integrated circuit (ASIC), field-programmable gate array (FPGA), or other programmable logic device, discrete gate or transistor logic device, discrete hardware component, etc. The general-purpose processor may be a microprocessor, alternatively the processor may also be any conventional processor or the like.

The foregoing memory 51 in some embodiments may be an internal storage unit of the foregoing terminal 5, such as a hard disk or storage of the terminal 5. The above-mentioned memory 51 in other embodiments may also be an external storage device of the terminal 5, such as a plug-in hard disk, a smart media card (SMC), a secure digital (SD), or a Flash card, etc. equipped on the terminal 5. Further, the aforementioned memory 51 may also include both an internal storage unit and an external storage device of the terminal 5. The memory 51 is used to store an operating system, an application program, a boot loader, data, and other programs and the like, such as the program code of the computer program and the like. The memory 51 may also be used to temporarily store data that has been output or will be output.

It can be seen from the above that, in the solution of the present application, the preset number of vibration signals with different frequencies are sequentially applied to the battery to be detected through the vibration generation device, so that the battery to be detected generates one vibration response amplitude under the action of each of the vibration signals respectively; the response signal of the battery to be detected is collected by the response collection device, and the response signal includes the preset number of vibration response amplitudes of the battery to be detected; and whether the battery to be detected is malfunctioning is determined according to the response signal. The solution of the present application can quickly and non-destructively detect whether the battery is malfunctioning by analyzing the vibration characteristics of the battery.

It should be noted that since the method embodiments of the present application are based on the same concept, the specific functions and technical effects of the information exchange and execution processes among the above-mentioned devices/units may refer to the parts of the method embodiments, which will not be repeated herein.

Those skilled in the art can clearly understand that the division of the above-mentioned functional units and modules is only used as an example for the convenience and conciseness of the description. In practical applications, the above-mentioned functions can be allocated to different functional units and modules as required, that is, the internal structure of the above device is divided into different functional units or modules to complete all or part of the functions described above. The functional units and modules in the embodiments may be integrated into one processing unit, or each unit may exist alone physically, or two or more units may be integrated into one unit. The integrated units may be realized by a way of hardware or software functional units. In addition, the specific names of the functional units and modules are only used to facilitate distinguishing each other, and are not used to limit the protection scope of the present application. For the specific working processes of the units and modules in the foregoing system, reference may be made to the corresponding processes of the foregoing method embodiments, which will not be repeated herein.

An embodiment of the present application further provides a computer-readable storage medium on which a computer program is stored. When executed by a processor, the computer program implements the steps in the above-mentioned method embodiments. As an implementation of this embodiment, the computer-readable storage medium may be included in any computer product. Alternatively, the computer-readable storage medium itself may be regarded as a computer product.

An embodiment of the present application further provides a computer program product. When executed on a terminal, the computer program product causes the terminal to execute the steps in the foregoing method embodiments.

When the aforementioned integrated unit is implemented in the form of a software functional unit and sold or used as an independent product, it can be stored in a computer-readable storage medium. Based on such understanding, the realization of all or part of the processes of the above-mentioned embodiments of the methods in the present application may be completed through instructing relevant hardware by a computer program, and the computer program may be stored in the computer-readable storage medium. When executed by the processor, the computer program may implement the steps of the foregoing method embodiments. The computer program includes a computer program code which may be in the form of a source code, an object code, an executable file, or some intermediates or the like. The computer-readable medium may at least include: any entity or device capable of carrying the computer program code to the terminal, a recording medium, a computer memory, a read-only memory (ROM), a random access memory (RAM), a electrical carrier signal, a telecommunication signal, and a software distribution medium. For example, a U disk, a mobile hard disk, a diskette or a compact disc, etc. In some jurisdictions, according to legislation and patent practices, the computer-readable medium cannot be the electrical carrier signal or the telecommunication signal.

In the above-mentioned embodiments, the description for each embodiment has its own focus. For parts that are not detailed or recorded in a certain embodiment, reference may be made to related descriptions of other embodiments.

A person of ordinary skill in the art may realize that the units and the steps of the algorithms of the examples described in combination with the embodiments disclosed herein can be implemented by electronic hardware, or a combination of computer software and electronic hardware. Whether these functions are executed by hardware or software depends on the specific application and design constraints of the technical solution. Professionals and technicians can use different methods for specific applications to implement the described functions, but such implementations should not be considered beyond the scope of the present application.

In the embodiments provided in the present application, it should be understood that the disclosed device/network equipment and method may be implemented in other ways. For example, the embodiments for the device/network device described above are merely illustrative. For example, the division of the above-mentioned modules or units is only a division of logical functions, and there may be other divisions in actual implementation, for example, a plurality of units or components may be combined or integrated into another system, or some features may be omitted or not implemented. In addition, the displayed or discussed mutual coupling, or direct coupling or communication connection may be indirect coupling or communication connection through some interfaces, devices or units, and may be in the form of electrical, mechanical coupling or connection or other forms.

The units described above as separate components may or may not be physically separated, and the components displayed as units may or may not be physical units, that is, they may be located in one place, or they may be distributed on a plurality of network units. Some or all of the units may be selected according to actual needs to achieve the objectives of the solutions of the embodiments.

The above embodiments are only used to illustrate, but not to limit, the technical solutions of the present application. Although the present application has been described in detail with reference to the foregoing embodiments, those of ordinary skill in the art should understand that they can still modify the technical solutions recited in the foregoing embodiments, or equivalently replace some of the technical features, and these modifications or replacements do not cause the essence of the corresponding technical solutions to deviate from the spirit and scope of the technical solutions of the embodiments of the present application, and should be included within the scope of protection of the present application.

What is claimed is:

1. A battery malfunction detection method, comprising:
    applying a preset number of vibration signals with different frequencies to a battery to be detected through a vibration generation device;
    collecting a response signal of the battery to be detected through a response collection device, wherein the response signal comprises the preset number of vibration response amplitudes of the battery to be detected, and the preset number of vibration response amplitudes of the battery to be detected are generated by the battery to be detected in response to the vibration signals with different frequencies respectively;

determining whether the battery to be detected is malfunctioning according to the response signal;

wherein the step of determining whether the battery to be detected is malfunctioning according to the response signal comprises:

matching the response signal with response samples of a plurality of battery samples in a preset response sample library one by one, wherein the response sample library comprises a response sample of at least one malfunctioning battery sample and a response sample of at least one battery sample that is not malfunctioning, and each response sample corresponds to a piece of identification information used to indicate whether the battery sample associated with the response sample is malfunctioning, and the response sample comprises the preset number of vibration response amplitudes of the associated battery sample, wherein the preset number of vibration response amplitudes of the battery sample are generated by the associated battery sample under an action of the vibration signals with different frequencies respectively;

determining a best matching response sample which has the largest match degree with the response signal from the response samples of the plurality of the battery samples;

determining whether the battery to be detected is malfunctioning according to the identification information corresponding to the best matching response sample;

wherein the step of matching the response signal with response samples of a plurality of battery samples in a preset response sample library one by one comprises:

generating a response spectrum according to a target response sample, wherein an abscissa of the response spectrum indicates the frequency, an ordinate of the response spectrum indicates the vibration response amplitude, and the target response sample is the response sample of any one battery sample in the response sample library;

acquiring a peak point in the response spectrum and at least two neighboring points nearest to the peak point, and determining the peak point and the neighboring points as detection points;

calculating a standard deviation of the vibration response amplitudes corresponding to the detection points and determining this standard deviation as a first standard deviation;

acquiring the vibration response amplitudes of the battery to be detected from the response signal under the action of the vibration signals with at least two target frequencies so as to acquire at least two target vibration response amplitudes, wherein the at least two target frequencies are frequencies corresponding to the detection points;

calculating a standard deviation of the at least two target vibration response amplitudes and determining this standard deviation as a second standard deviation;

calculating an absolute difference between the first standard deviation and the second standard deviation;

acquiring a match degree between the response signal and the target response sample according to the absolute difference.

2. The battery malfunction detection method of claim 1, wherein the step of determining whether the battery to be detected is malfunctioning according to the identification information corresponding to the best matching response sample comprises:

determining that the battery to be detected is malfunctioning if the identification information corresponding to the best matching response sample indicates that the battery sample corresponding to the best matching response sample is malfunctioning;

determining that the battery to be detected is not malfunctioning if the identification information corresponding to the best matching response sample indicates that the battery sample corresponding to the best matching response sample is not malfunctioning.

3. The battery malfunction detection method of claim 1, wherein the step of matching the response signal with response samples of a plurality of battery samples in a preset response sample library one by one comprises:

analyzing correlation between the response signal and the target response sample to acquire a correlation coefficient between the response signal and the target response sample, wherein the target response sample is the response sample of any one battery sample in the response sample library;

determining the correlation coefficient as the match degree between the response signal and the target response sample.

4. The battery malfunction detection method of claim 3, wherein the method, before analyzing correlation between the response signal and the target response sample to acquire a correlation coefficient between the response signal and the target response sample, further comprises:

filtering out the vibration response amplitude less than a preset response threshold from the response signal and the target response sample, and retaining said filtered response signal and said filtered target response sample as a retained response signal and a retained target response sample, respectively;

correspondingly, the step of analyzing correlation between the response signal and the target response sample to acquire the correlation coefficient between the response signal and the target response sample comprises:

performing correlation analysis on the retained response signal and the retained target response sample to acquire the correlation coefficient between the response signal and the target response sample.

5. A battery malfunction detection system, comprising a terminal, a vibration generation device connected to the terminal, and a response collection device connected to the terminal, wherein the vibration generation device is configured to apply a vibration signal to a battery to be detected, and the response collection device is configured to collect a vibration response amplitude of the battery to be detected;

the terminal comprises:

a vibration generation unit configured to sequentially apply a preset number of vibration signals with different frequencies to the battery to be detected through the vibration generation device;

a response collection unit configured to collect a response signal of the battery to be detected through the response collection device, wherein the response signal comprises the preset number of vibration response amplitudes of the battery to be detected which are generated by the battery to be detected under an action of the vibration signals with different frequencies respectively;

a malfunction determination unit configured to determine whether the battery to be detected is malfunctioning according to the response signal;

wherein the vibration generation device comprises a sweeper signal generator, a sheet ceramic and a carrier plate;

wherein an input end of the sweeper signal generator is connected in communication with the terminal, and the sweeper signal generator is configured to generate a sinusoidal electrical signal according to control of the terminal;

the sheet ceramic is connected to an output end of the sweeper signal generator and is configured to convert the sinusoidal electrical signal into the vibration signal;

the carrier plate is fixedly connected to the sheet ceramic, and is configured to place the battery to be detected thereon and transmit the vibration signal to the battery to be detected;

the response collection device comprises a signal processor and a laser interferometer, wherein the laser interferometer is connected to the signal processor 142, and is configured to emit a first laser signal to a surface of the battery to be detected, receive a second laser signal reflected back from the surface of the battery to be detected, and send the second laser signal to the signal processor;

the signal processor is connected to the terminal, and is configured to process the second laser signal to acquire a frequency of the vibration signal transmitted to the battery to be detected and the vibration response amplitude of the battery to be detected, and send the frequency of the vibration signal transmitted to the battery to be detected and the vibration response amplitude of the battery to be detected to the terminal.

6. The battery malfunction detection system of claim 5, wherein the malfunction determination unit comprises:

a match subunit configured to match the response signal with response samples of a plurality of battery samples in a preset response sample library one by one, wherein the response sample library comprises a response sample of at least one malfunctioning battery sample and a response sample of at least one battery sample that is not malfunctioning, and each response sample corresponds to a piece of identification information used to indicate whether the battery sample associated with the response sample is malfunctioning, and the response sample comprises the preset number of vibration response amplitudes of the associated battery sample, wherein the preset number of vibration response amplitudes of the battery sample are generated by the associated battery sample under an action of the vibration signals with different frequencies;

a sample determination subunit configured to determine a best matching response sample which has the largest match degree with the response signal from the response samples of the plurality of the battery samples;

a malfunction determination subunit configured to determine whether the battery to be detected is malfunctioning according to the identification information corresponding to the best matching response sample.

7. The battery malfunction detection system of claim 6, wherein the malfunction determination subunit comprises:

a first malfunction determination subunit configured to determine that the battery to be detected is malfunctioning if the identification information corresponding to the best matching response sample indicates that the battery sample corresponding to the best matching response sample is malfunctioning;

a second malfunction determination subunit configured to determine that the battery to be detected is not malfunctioning if the identification information corresponding to the best matching response sample indicates that the battery sample corresponding to the best matching response sample is not malfunctioning.

8. The battery malfunction detection system of claim 6, wherein the match subunit comprises:

a spectrum generation subunit configured to generate a response spectrum according to a target response sample, wherein an abscissa of the response spectrum indicates the frequency, an ordinate of the response spectrum indicates the vibration response amplitude, and the target response sample is the response sample of any one battery sample in the response sample library;

a detection point acquisition subunit configured to acquire a peak point in the response spectrum and at least two neighboring points nearest to the peak point and determine the peak point and the neighboring points as detection points;

a first standard deviation calculation subunit configured to calculate a standard deviation of the vibration response amplitudes corresponding to the detection points and determine this standard deviation as a first standard deviation;

a target amplitude acquisition subunit configured to acquire the vibration response amplitudes of the battery to be detected from the response signal under the action of the vibration signals with at least two target frequencies so as to acquire at least two target vibration response amplitudes, wherein the at least two target frequencies are frequencies corresponding to the detection points;

a second standard deviation calculation subunit configured to calculate a standard deviation of the at least two target vibration response amplitudes and determine this standard deviation as a second standard deviation;

an absolute value calculation subunit configured to calculate an absolute difference between the first standard deviation and the second standard deviation;

a match degree calculation subunit configured to acquire a match degree between the response signal and the target response sample according to the absolute difference.

9. The battery malfunction detection system of claim 8, wherein the match subunit further comprises:

a filtering subunit configured to filter out the vibration response amplitude less than a preset response threshold from the response signal and the target response sample.

10. The battery malfunction detection system of claim 6, wherein the match subunit comprises:

a correlation analysis subunit configured to analyze correlation between the response signal and the target response sample to acquire a correlation coefficient between the response signal and the target response sample, wherein the target response sample is the response sample of any one battery sample in the response sample library;
a match degree determination subunit configured to determine the correlation coefficient as the match degree between the response signal and the target response sample.

11. The battery malfunction detection system of claim 10, wherein the correlation analysis subunit comprises:
a filtering subunit configured to filter out the vibration response amplitude less than a preset response threshold from the response signal and the target response sample, and retain said filtered response signal and said filtered target response sample as a retained response signal and a retained target response sample, respectively; and
a correlation coefficient determination subunit configured to perform correlation analysis on the retained response signal and the retained target response sample to acquire the correlation coefficient between the response signal and the target response sample.

12. A computer product, comprising a computer-readable storage medium which a computer program is stored thereon, wherein the computer program, when executed by a processor, implements the following steps of:
collecting a response signal of a battery to be detected, wherein the response signal comprises a preset number of vibration response amplitudes of the battery to be detected, and the preset number of vibration response amplitudes of the battery to be detected are generated by the battery to be detected under an action of vibration signals with different frequencies respectively; and
determining whether the battery to be detected is malfunctioning according to the response signal;
wherein the step of determining whether the battery to be detected is malfunctioning according to the response signal comprises:
matching the response signal with response samples of a plurality of battery samples in a preset response sample library one by one, wherein the response sample library comprises a response sample of at least one malfunctioning battery sample and a response sample of at least one battery sample that is not malfunctioning, and each response sample corresponds to a piece of identification information used to indicate whether the battery sample associated with the response sample is malfunctioning, and the response sample comprises the preset number of vibration response amplitudes of the associated battery sample, wherein the preset number of vibration response amplitudes of the battery sample are generated by the associated battery sample under the action of the vibration signals with different frequencies respectively;
determining a best matching response sample which has the largest match degree with the response signal from the response samples of the plurality of the battery samples; and
determining whether the battery to be detected is malfunctioning according to the identification information corresponding to the best matching response sample;
wherein the step of matching the response signal with response samples of a plurality of battery samples in a preset response sample library one by one comprises:
generating a response spectrum according to a target response sample, wherein an abscissa of the response spectrum indicates the frequency, an ordinate of the response spectrum indicates the vibration response amplitude, and the target response sample is the response sample of any one battery sample in the response sample library;
acquiring a peak point in the response spectrum and at least two neighboring points nearest to the peak point, and determining the peak point and the neighboring points as detection points;
calculating a standard deviation of the vibration response amplitudes corresponding to the detection points and determining this standard deviation as a first standard deviation;
acquiring the vibration response amplitudes of the battery to be detected from the response signal under the action of the vibration signals with at least two target frequencies so as to acquire at least two target vibration response amplitudes, wherein the at least two target frequencies are frequencies corresponding to the detection points;
calculating a standard deviation of the at least two target vibration response amplitudes and determining this standard deviation as a second standard deviation;
calculating an absolute difference between the first standard deviation and the second standard deviation; and
acquiring a match degree between the response signal and the target response sample according to the absolute difference.

13. The computer product of claim 12, wherein the step of determining whether the battery to be detected is malfunctioning according to the identification information corresponding to the best matching response sample comprises:
determining that the battery to be detected is malfunctioning if the identification information corresponding to the best matching response sample indicates that the battery sample corresponding to the best matching response sample is malfunctioning; and
determining that the battery to be detected is not malfunctioning if the identification information corresponding to the best matching response sample indicates that the battery sample corresponding to the best matching response sample is not malfunctioning.

14. The computer product of claim 12, wherein the step of matching the response signal with response samples of a plurality of battery samples in a preset response sample library one by one comprises:
analyzing correlation between the response signal and the target response sample to acquire a correlation coefficient between the response signal and the target response sample, wherein the target response sample is the response sample of any one battery sample in the response sample library;
determining the correlation coefficient as the match degree between the response signal and the target response sample.

15. The computer product of claim 14, wherein before analyzing correlation between the response signal and the target response sample to acquire a correlation coefficient between the response signal and the target response sample, the computer program, when executed by a processor, further implements the following step of:
filtering out the vibration response amplitude less than a preset response threshold from the response signal and the target response sample, and retaining said filtered response signal and said filtered target response sample as a retained response signal and a retained target response sample, respectively;
correspondingly, the step of analyzing correlation between the response signal and the target response sample to acquire the correlation coefficient between the response signal and the target response sample comprises:

performing correlation analysis on the retained response signal and the retained target response sample to acquire the correlation coefficient between the response signal and the target response sample.

* * * * *